(12) United States Patent
Rocha-Alvarez et al.

(10) Patent No.: US 10,385,448 B2
(45) Date of Patent: Aug. 20, 2019

(54) APPARATUS AND METHOD FOR PURGING GASEOUS COMPOUNDS

(71) Applicant: Applied Materials, Inc., Santa Clara, CA (US)

(72) Inventors: Juan Carlos Rocha-Alvarez, San Carlos, CA (US); Amit Kumar Bansal, Sunnyvale, CA (US); Ganesh Balasubramanian, Sunnyvale, CA (US); Jianhua Zhou, Campbell, CA (US); Ramprakash Sankarakrishnan, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 914 days.

(21) Appl. No.: 14/036,170

(22) Filed: Sep. 25, 2013

(65) Prior Publication Data

US 2014/0083523 A1    Mar. 27, 2014

Related U.S. Application Data

(60) Provisional application No. 61/706,098, filed on Sep. 26, 2012.

(51) Int. Cl.
| | | |
|---|---|---|
| *C23C 16/44* | (2006.01) | |
| *C23C 16/455* | (2006.01) | |

(Continued)

(52) U.S. Cl.
CPC .... *C23C 16/4412* (2013.01); *C23C 16/45519* (2013.01); *C23C 16/45565* (2013.01);
(Continued)

(58) Field of Classification Search
CPC .......... C23C 16/4412; C23C 16/45519; F16L 53/001; H01L 21/67167
(Continued)

(56) References Cited

U.S. PATENT DOCUMENTS

| | | | | |
|---|---|---|---|---|
| 5,780,360 A | * | 7/1998 | Tseng et al. | 438/680 |
| 5,884,009 A | * | 3/1999 | Okase | H01L 21/67017 219/405 |

(Continued)

FOREIGN PATENT DOCUMENTS

| | | |
|---|---|---|
| JP | 2003277936 A | 10/2003 |
| JP | 2004217956 A | 8/2004 |

(Continued)

OTHER PUBLICATIONS

PCT International Search Report and Written Opinion dated Jan. 13, 2014, for International Application No. PCT/US2013/061581.

(Continued)

*Primary Examiner* — Kevin F Murphy
*Assistant Examiner* — Paul J Gray
(74) *Attorney, Agent, or Firm* — Patterson + Sheridan LLP

(57) ABSTRACT

A processing chamber is described having a gas evacuation flow path from the center to the edge of the chamber. Purge gas is introduced at an opening around a support shaft that supports a heater plate. A shaft wall around the opening directs the purge gas along the support shaft to an evacuation plenum. Gas flows from the evacuation plenum through an opening in a second plate near the shaft wall and along the chamber bottom to an opening coupled to a vacuum source. Purge gas is also directed to the slit valve.

17 Claims, 2 Drawing Sheets

(51) Int. Cl.
    *F27D 7/02*     (2006.01)
    *F27D 7/06*     (2006.01)
    *H01J 37/32*     (2006.01)

(52) U.S. Cl.
    CPC ............... *F27D 7/02* (2013.01); *F27D 7/06* (2013.01); *H01J 37/3244* (2013.01); *H01J 37/32834* (2013.01); *H01J 2237/3321* (2013.01); *Y10T 137/6416* (2015.04)

(58) Field of Classification Search
    USPC ........................................... 118/50, 52, 319
    See application file for complete search history.

(56) References Cited

U.S. PATENT DOCUMENTS

| | | | |
|---|---|---|---|
| 6,602,346 B1* | 8/2003 | Gochberg | H01L 21/67126 118/715 |
| 2006/0160359 A1 | 7/2006 | Kasai et al. | |
| 2009/0107955 A1* | 4/2009 | Tiner | C23C 16/4404 216/67 |
| 2010/0206231 A1* | 8/2010 | Yoon | H01J 37/32357 118/723 I |
| 2011/0214611 A1* | 9/2011 | Kato et al. | 118/719 |

FOREIGN PATENT DOCUMENTS

| | | |
|---|---|---|
| JP | 2005109342 A | 4/2005 |
| KR | 20080095099 A | 10/2008 |
| KR | 20080095103 A | 10/2008 |
| KR | 1020100059238 | 6/2010 |

\* cited by examiner

APPARATUS AND METHOD FOR PURGING GASEOUS COMPOUNDS

CROSS-REFERENCE TO RELATED APPLICATIONS

This application claims benefit of U.S. Provisional Patent Application Ser. No. 61/706,098 filed Sep. 26, 2012, which is incorporated herein by reference.

BACKGROUND OF THE INVENTION

Field of the Invention

Embodiments of the present invention generally relate to an apparatus and method for purging gaseous compounds from a processing chamber.

SUMMARY OF THE INVENTION

The present invention generally relates to an apparatus and method for purging gaseous compounds from a chamber. Processing gas is pulled down below a heater plate by a vacuum pump. Purging gas is introduced through the slit valve as well as along the stem holding up the heater plate. The purge gas collectively directs the processing gas to flow towards the vacuum pump. In absence of the purge gas, the processing gas would recirculate rather than evacuate from the processing chamber.

DETAILED DESCRIPTION OF THE INVENTION

The present invention generally relates to an apparatus and method for purging gaseous compounds from a chamber. FIG. 1 shows an apparatus 100 comprising a processing chamber 102. Within the processing chamber 102, a gas distribution showerhead 104 is present that has a plurality of openings 105 therethrough to permit processing gas to pass through the showerhead 104. Substrates are inserted into and removed from the processing chamber 102 through a slit valve opening 106 formed through the chamber body. A heater plate 108 is disposed across the processing space 116 from the showerhead 104. The heater plate 108 is disposed on a support stem 126. Below the heater plate 108 is a second plate 110 that is spaced from the heater plate 108 by an evacuation plenum 120. Processing gas is delivered from a precursor gas source 112 for processing a substrate within the chamber 102. The gas travels from the source 112 into a plenum 114 where the gas is evenly distributed before passing through the openings 105 formed in the showerhead 104. The precursor gas travels along the path shown by arrows labeled "A".

Once in the processing area 116, the processing gas is exposed to the substrate (not shown) to process the substrate. The processing gas may be ignited into a plasma if desired. To leave the chamber 102, the processing gas is evacuated by a vacuum pump 124 through the bottom of the chamber 102. As shown in FIG. 1, the processing gas is drawn around the heater plate 108 through a gap 118 formed between the heater plate 108 and the chamber wall. The gas is drawn into the evacuation plenum 120 between the heater plate 108 and the second plate 110.

In order to ensure the processing gas flows out of the chamber and doesn't simply circulate around within the plenum 120, a purging gas is introduced from a purge gas source 122. The purging gas is introduced from two locations. The first location is from the bottom of the chamber 102 between the stem 126 and a shaft wall 128. The purging gas flows along a path identified by arrows "B". The purging gas flows up between the stem 126 and the shaft wall 128 and emerges from an opening 130 into the plenum 120. Additionally, purging gas is introduced from a second location, within the slit valve opening 106. The purge gas from the slit valve opening 106 flows along a path identified by arrows "C" into the plenum 120. As shown, the purge gases and processing gas collectively flow within the plenum towards an opening 132 formed in the second plate 110 and into the bottom plenum 134 and out of the chamber 102 through the vacuum pump 124.

FIG. 2 is a schematic illustration of the gas flow within the apparatus of FIG. 1 when introducing purging gas. As can be seen from FIG. 2, the processing gas mixes well with the purging gas and generally flows towards opening 132 in plate 110. Contrasting with FIG. 3, FIG. 3 is a schematic illustration of the gas flow within the apparatus of FIG. 1 without the purge gas flow. As shown in FIG. 3, when no purging gas is introduced, the processing gas recirculates within plenum 120.

Thus, by introducing purge gas through the bottom of the chamber, together with purge gas from the slit valve opening, processing gas can effectively be evacuated from a processing chamber through the bottom of the chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
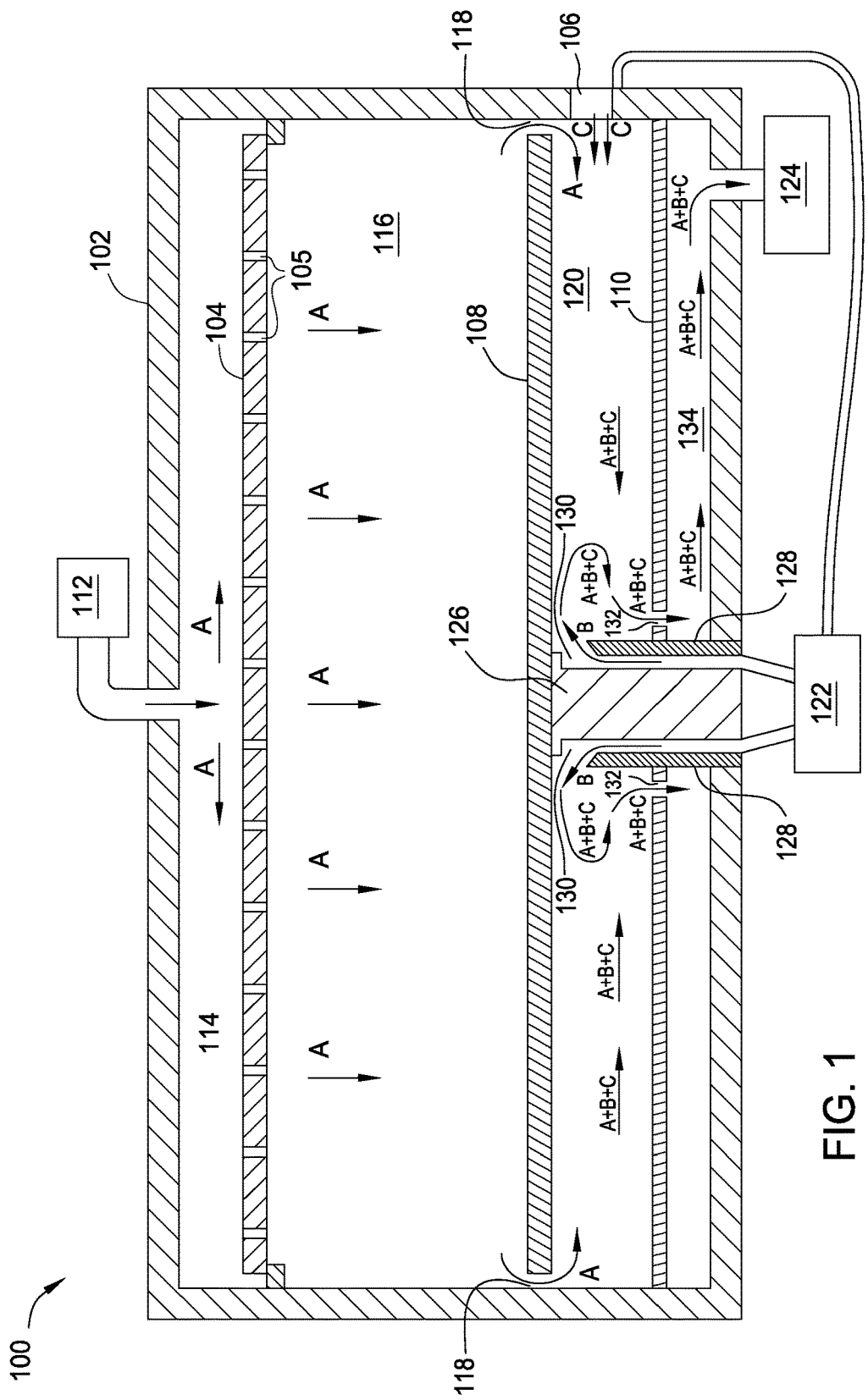
FIG. 1 is a schematic cross-sectional illustration of an apparatus according to one embodiment.
Figure 2:
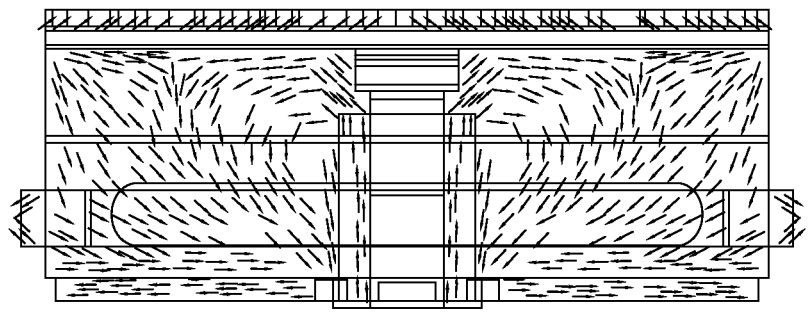
FIG. 2 is a schematic illustration of the gas flow within the apparatus of FIG. 1 when introducing purging gas.
Figure 3:
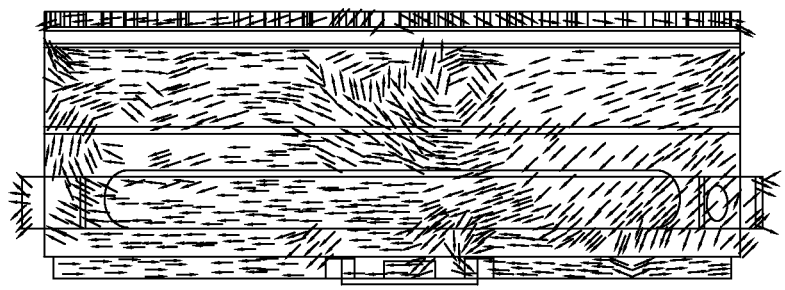
FIG. 3 is a schematic illustration of the gas flow within the apparatus of FIG. 1 without the purge gas flow.

While the foregoing is directed to embodiments of the present invention, other and further embodiments of the invention may be devised without departing from the basic scope thereof, and the scope thereof is determined by the claims that follow.

The invention claimed is:

1. An apparatus for processing a substrate, comprising:
a chamber with a side wall and a chamber bottom;
a heater plate disposed on a support stem, the support stem centrally located in the chamber and extending through an opening formed in the chamber bottom;
a shaft wall radially disposed around the support stem extending from the chamber bottom;
a second plate coupled to the side wall and the shaft wall and extending there between, the second plate disposed below the heater plate, the second plate forming an evacuation plenum between the heater plate and the second plate and a bottom plenum between the second plate and the chamber bottom wall, the second plate having an opening proximate to the support stem and fluidly coupling the evacuation plenum with the bottom plenum, the evacuation plenum and bottom plenum disposed below the heater plate, the evacuation plenum configured to direct gas radially inward from the side wall, the bottom plenum configured to direct gas radially outward from the support stem;

a gas distribution showerhead opposite the heater plate forming a processing area between the heater plate and the gas distribution showerhead; and a peripheral opening in the chamber bottom configured to couple to a vacuum pump.

2. The apparatus of claim 1, wherein the peripheral opening in the chamber bottom is located near the side wall of the chamber.

3. The apparatus of claim 2, wherein a central opening through the chamber bottom is in fluid communication with the opening in the second plate through a gap between the shaft wall and the support stem.

4. The apparatus of claim 3, wherein the shaft wall surrounding the support stem forms a gas flow pathway from the central opening in the bottom to the evacuation plenum.

5. The apparatus of claim 4, further comprising a gap between the heater plate and the side wall that forms at least a portion of the gas flow path from the processing area to the evacuation plenum.

6. The apparatus of claim 5, further comprising a slit valve opening with an introduction location configured to be coupled to a source of purge gas.

7. The apparatus of claim 6, wherein the slit valve opening is located in the side wall of the chamber below the heater plate when the heater plate is disposed in a processing position.

8. The apparatus of claim 1, wherein the second plate is attached to the side wall.

9. An apparatus for processing a substrate, comprising:
a chamber with a side wall and a chamber bottom;
a heater plate disposed inside the chamber on a support stem, wherein the support stem is centrally located in the chamber and extends through an opening formed in the chamber bottom;
a shaft wall radially disposed around the support stem extending form the chamber bottom;
a second plate coupled to the side wall and the shaft wall and extending there between, the second plate dispose below the heater plate, the second plate forming an evacuation plenum between the heater plate and the second plate and a bottom plenum between the second plate and the chamber bottom, the second plate having an opening proximate to the support stem and fluidly coupling the evacuation plenum with the bottom plenum, the evacuation plenum and bottom plenum disposed below the heater plate, the evacuation plenum configured to direct gas radially inward from the side wall, the bottom plenum configured to direct gas radially outward from the support stem;

a slit valve opening with a purge gas location coupled to a purge gas source, wherein the slit valve opening is located in the side wall of the chamber; and a third opening in the chamber bottom at a peripheral location of the chamber.

10. The apparatus of claim 9, wherein a gas flow pathway comprises a space between the support stem and a shaft wall.

11. The apparatus of claim 10, wherein the gas flow pathway further comprises the second plate below the heater plate, the second plate having an opening near the shaft wall.

12. The apparatus of claim 11, further comprising a gap between the heater plate and the side wall of the chamber.

13. The apparatus of claim 12, wherein the space between the support stem and the shaft wall is configured to be coupled to a source of purge gas.

14. The apparatus of claim 10, wherein the shaft wall surrounds the support stem.

15. The apparatus of claim 11, wherein the second plate is attached to the side wall.

16. An apparatus for processing a substrate, comprising:
a chamber having a side wall and a chamber bottom;
a heater plate disposed within the chamber on a support stem, the support stem centrally located in the chamber and extending through the chamber bottom;
a gas distribution showerhead opposite the heater plate defining a processing area between the heater plate and the gas distribution showerhead, a plurality of openings disposed in the showerhead configured to direct a gas flow into the processing area;
a shaft wall surrounding a first opening, the first opening formed in the chamber bottom around the support stem, and the first opening configured to be fluidly coupled to a purge gas source; and
a second plate coupled to the side wall and the shaft wall and extending therebetween, the second plate disposed below the heater plate, wherein the second plate forms an evacuation plenum between the heater plate and the second plate and a bottom plenum between the second plate and the chamber bottom, the second plate having a second opening proximate to the support stem and fluidly coupling the evacuation plenum with the bottom plenum, the evacuation plenum and bottom plenum disposed below the heater plate, the evacuation plenum configured to direct gas radially inward from the side wall, the bottom plenum configured to direct gas radially outward from the support stem, and wherein
the chamber bottom has a third opening formed therethrough at a periphery of the chamber and the third opening is configured to be coupled to a vacuum source.

17. The apparatus of claim 16, wherein the second plate is attached to the side wall.

* * * * *

UNITED STATES PATENT AND TRADEMARK OFFICE
CERTIFICATE OF CORRECTION

PATENT NO. : 10,385,448 B2
APPLICATION NO. : 14/036170
DATED : August 20, 2019
INVENTOR(S) : Juan Carlos Rocha-Alvarez et al.

Page 1 of 1

It is certified that error appears in the above-identified patent and that said Letters Patent is hereby corrected as shown below:

In the Claims

In Column 2, Line 63, in Claim 1, delete "bottom wall," and insert -- bottom, --, therefor.

In Column 3, Line 19, in Claim 4, delete "the" and insert -- the chamber --, therefor.

In Column 3, Line 42, in Claim 9, delete "dispose" and insert -- disposed --, therefor.

Signed and Sealed this
Eighth Day of October, 2019

Andrei Iancu
*Director of the United States Patent and Trademark Office*